(12) United States Patent
Kim et al.

(10) Patent No.: US 11,508,793 B2
(45) Date of Patent: Nov. 22, 2022

(54) ORGANIC LIGHT EMITTING DIODE DISPLAY

(71) Applicant: Samsung Display Co., Ltd., Yongin-si (KR)

(72) Inventors: Min-Sung Kim, Hwaseong-si (KR); Thanh Tien Nguyen, Seoul (KR); Ki Ju Im, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 242 days.

(21) Appl. No.: 16/859,270

(22) Filed: Apr. 27, 2020

(65) Prior Publication Data

US 2020/0258965 A1     Aug. 13, 2020

Related U.S. Application Data

(63) Continuation of application No. 14/755,719, filed on Jun. 30, 2015, now Pat. No. 10,665,651.

(30) Foreign Application Priority Data

Jan. 15, 2015    (KR) ........................ 10-2015-0007630

(51) Int. Cl.
    *H01L 27/32*       (2006.01)
    *G09G 3/3233*     (2016.01)

(52) U.S. Cl.
    CPC ....... *H01L 27/3258* (2013.01); *G09G 3/3233* (2013.01); *G09G 2300/0819* (2013.01); *G09G 2300/0852* (2013.01); *G09G 2300/0861* (2013.01); *G09G 2310/0251* (2013.01); *G09G 2310/0262* (2013.01); *H01L 2251/5338* (2013.01)

(58) Field of Classification Search
    CPC ......... H01L 2251/5338; H01L 27/3258; H01L 51/0097; H01L 23/4985; H01L 29/78618
    See application file for complete search history.

(56) References Cited

U.S. PATENT DOCUMENTS 5,367,179 A    11/1994   Mori et al.
6,077,792 A     6/2000   Farrar
(Continued)

FOREIGN PATENT DOCUMENTS

JP        2007-288078      11/2007
KR    10-2011-0072269    6/2011
(Continued)

*Primary Examiner* — Peter M Albrecht
(74) *Attorney, Agent, or Firm* — Kile Park Reed & Houtteman PLLC

(57) ABSTRACT

An organic light emitting diode display includes a flexible substrate including a folding area and a flat area, a first insulating layer on the flexible substrate having a first opening, a first conductor on the first insulating layer, and a second insulating layer covering the first conductor with the first insulating layer also having the first opening. The organic light emitting diode display further includes a second conductor on the second insulating layer, a third insulating layer covering the second conductor and the second insulating layer, and a filling material in the first opening. A thickness of the filling material in the first opening is less than a thickness from a bottom surface of the first insulating layer to an upper surface of the second insulating layer.

12 Claims, 7 Drawing Sheets

(56) References Cited

U.S. PATENT DOCUMENTS

| | | |
|---|---|---|
| 2001/0015256 A1 | 8/2001 | Yamazaki et al. |
| 2003/0071567 A1* | 4/2003 | Eida .................... H01L 51/5036 |
| | | 313/504 |
| 2006/0202206 A1 | 9/2006 | Koyama et al. |
| 2007/0090420 A1 | 4/2007 | Chu et al. |
| 2007/0158641 A1 | 7/2007 | Takeuchi et al. |
| 2007/0285594 A1 | 12/2007 | Kang et al. |
| 2008/0111130 A1 | 5/2008 | Okuyama |
| 2011/0303921 A1 | 12/2011 | Shin et al. |
| 2014/0097408 A1* | 4/2014 | Kim .................... H01L 27/3237 |
| | | 257/40 |
| 2014/0138640 A1 | 5/2014 | Kim et al. |
| 2015/0091005 A1 | 4/2015 | Park |
| 2015/0108484 A1 | 4/2015 | Park et al. |
| 2016/0111551 A1 | 4/2016 | Yan et al. |
| 2016/0118451 A1 | 4/2016 | Youn et al. |

FOREIGN PATENT DOCUMENTS

| | | |
|---|---|---|
| KR | 10-2012-0044813 | 5/2012 |
| KR | 10-2014-0042553 | 4/2014 |
| KR | 10-2014-0060822 | 5/2014 |

\* cited by examiner

ORGANIC LIGHT EMITTING DIODE DISPLAY

CROSS-REFERENCE TO RELATED APPLICATION

This is a continuation application based on U.S. patent application Ser. No. 14/755,719, filed Jun. 30, 2015 (now issued as U.S. Pat. No. 10,655,651), the disclosure of which is incorporated herein by reference in its entirety. U.S. patent application Ser. No. 14/755,719 claims priority benefit of Korean Patent Application No. 10-2015-0007630 under 35 U.S.C. § 119, filed on Jan. 15, 2015, the disclosure of which is incorporated herein by reference in its entirety for all purposes.

BACKGROUND

1. Field

One or more embodiments herein relate to an organic light emitting diode display.

2. Description of the Related Art

An organic light emitting diode display generates images using a plurality of pixels. Each pixel includes an organic emission layer positioned between two electrodes. The pixel emits light when electrons from a cathode and holes from an anode recombine in the organic emission layer to form excitons which then change state.

Various types of organic light emitting diode displays have been developed. Examples includes flexible displays, curved displays, foldable displays, rollable displays, and stretchable displays. When the display is curved, folded, or rolled, stress is generated by an inorganic layer, e.g., barrier layer, buffer layer, gate insulating layer, or an interlayer insulating layer. In order to distribute the stress, a groove may be formed by etching part of the inorganic layer between pixels. The etching separates the pixels to create an island-type structure.

However, the thickness of the inorganic layer between a gate electrode and a data line or a driving voltage line is decreased when over-etching occurs. In this case, the inorganic layer may serve as a current leakage pass.

Further, the tapered angle of a data metal layer in the groove may increase as a result of the etching, and thus the thickness of the data metal layer in the groove may partially increase. Accordingly, when the data line or the driving voltage line is formed by etching the data metal layer by a photolithography process substantially in the vertical direction at the groove, at least a portion of the data metal layer may not be etched. The unetched portion of the data metal layer may disconnect the data line and the driving voltage line from each other to create the current leakage pass.

Further, when the groove is formed by etching the inorganic layer, the entire path of the data line or the driving voltage line passing through the groove increases. Consequently, the resistance of the data line or the driving voltage line increases and thus it is difficult to stably supply current to the pixel.

SUMMARY

In accordance with one or more embodiments, an organic light emitting diode display includes a substrate; a plurality of first signal lines on the substrate and extending in a first direction, a first insulating layer covering the substrate and the first signal lines; a plurality of second signal lines on the first insulating layer and crossing the first signal line; a plurality of pixels connected to the first signal lines and the second signal lines; and a groove in the first insulating layer to separate adjacent ones of the pixels; and a filling material in the groove.

The groove may extend in a same direction as the first signal lines. The second signal line may pass across a top of the filling material. The first signal lines may include a scan line to transfer a scan signal, the second signal lines may include a data line to transfer a data signal and a driving voltage line to transfer a driving voltage, and the data line and driving voltage line may pass across the top of the filling material.

The first insulating layer may include a gate insulating layer covering the scan line and an interlayer insulating layer covering the gate insulating layer, and the separation groove passes through the gate insulating layer and the interlayer insulating layer. The first insulating layer may include an inorganic material, and the filling material may include an elastic material. A Young's modulus of the filling material may be smaller than a Young's modulus of the first insulating layer. The elastic material may include an organic material or a viscoelastic material.

The display may include a barrier film and a buffer layer between the substrate and the first insulating layer, wherein the groove extends up to the barrier film and the buffer layer. Each of the barrier film and buffer layer may include an inorganic material, and a Young's modulus of the filling material may be smaller than a Young's modulus of the barrier film and the buffer layer. An upper surface of the first insulating layer and an upper surface of the filling material maybe at substantially a same level.

Each of the pixels may include a light emitting diode and a plurality of transistors connected to the scan line, the data line, and the driving voltage line. The substrate may have a folding area and some of the pixels, the groove, and the filling material may correspond the folding area.

In accordance with one or more other embodiments, a display includes a layer; a groove in the layer; and a filling material in the groove, wherein the groove separates a first pixel from a second pixel to distribute stress during bending of a surface of the display. The first and second pixels may have an island-type structure based on the groove. The layer may include an insulating material. The filling material may include an elastic material. A Young's modulus of the filling material may be smaller than a Young's modulus of the layer. A data line may extend passing across the filing material along a substantially coplanar path. A driving voltage line may extend across the filling material along a substantially coplanar path.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
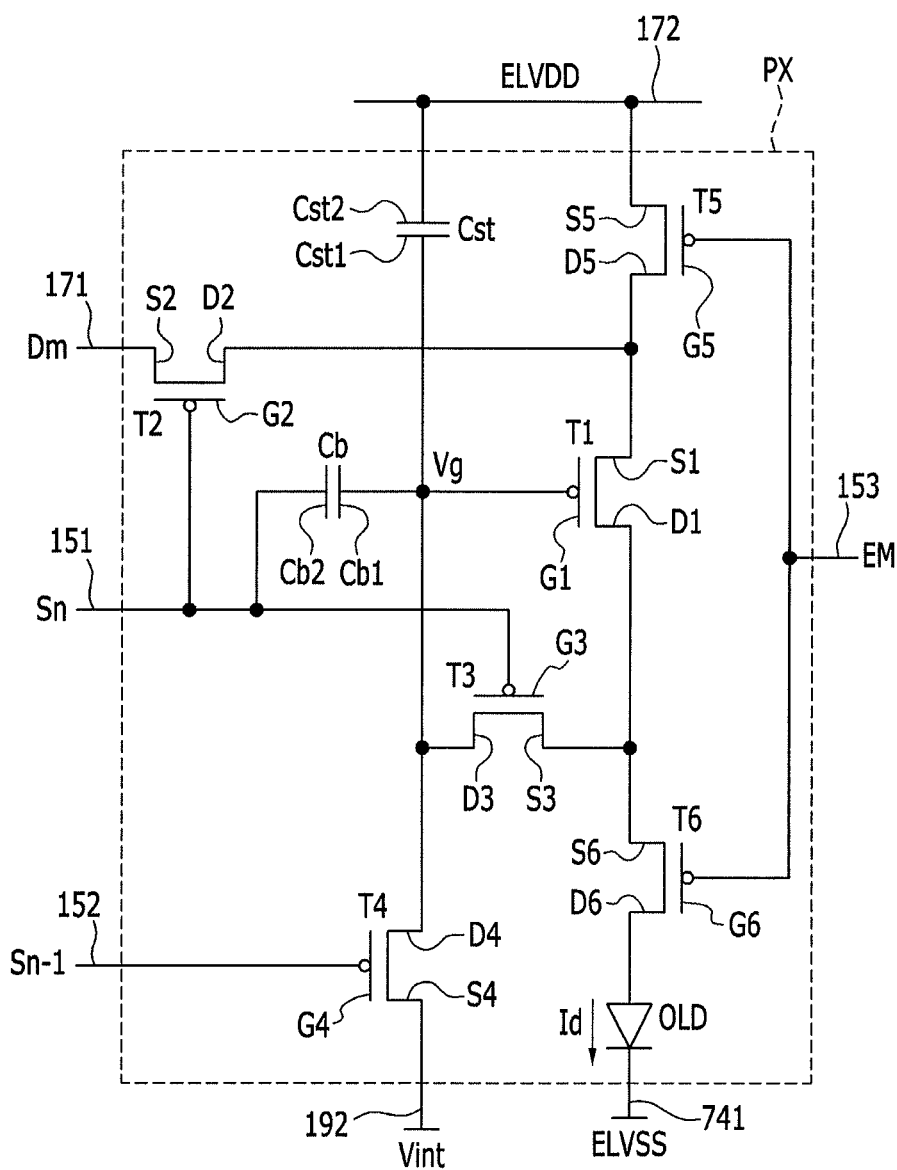
FIG. 1 illustrates an embodiment of an organic light emitting diode display.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 is an embodiment of an organic light emitting diode display which includes a plurality of pixels PX connected to a plurality of signal lines and arranged substantially in a matrix. Each pixel PX includes a plurality of transistors connected to the signal lines, a plurality of capacitors, and an organic light emitting diode OLD.

The signal lines include a scan line 151, a previous scan line 152, a light emission control line 153, and an initialization voltage line 192 which apply a scan signal Sn, a previous scan signal Sn-1, a light emission control signal EM, and an initialization voltage Vint formed in a row direction. The signal lines also include a data line 171 and a driving voltage line 172 which cross the scan line 151, the previous scan line 152, the light emission control line 153, and the initialization voltage line 192. The data line 171 and the driving voltage line 172 apply a data signal Dm and a driving voltage ELVDD, respectively.

The transistors include a driving thin film transistor T1, a switching thin film transistor T2, a compensation transistor T3, an initialization transistor T4, an operation control transistor T5, and a light emission control transistor T6, and the capacitors Cst and Cb includes a storage capacitor Cst and a boosting capacitor Cb.

The driving thin film transistor T1 has a gate electrode G1 connected to one end Cst1 of the storage capacitor Cst, a source electrode S1 connected to the driving voltage line 172 via the operation control thin film transistor T5, and a drain electrode D1 connected to an anode of the organic light emitting diode OLD via the light emission control transistor T6. The driving thin film transistor T1 receives the data signal Dm, according to a switching operation of the switching thin film transistor T2, to supply a driving current ld to the organic light emitting diode OLD.

The switching thin film transistor T2 has a gate electrode G2 connected to the scan line 151, a source electrode S2 connected to the data line 171, and a drain electrode D2 connected to the source electrode Si of the driving thin film transistor T1 and connected to the driving voltage line 172 via the operation control transistor T5. The switching thin film transistor T2 is turned on according to the scan signal Sn received through the scan line 151. The switching thin film transistor T2 performs a switching operation that transfers the data signal Dm from the data line 171 to the source electrode Si of the driving thin film transistor T1.

The compensation transistor T3 has a gate electrode G3 connected to the scan line 151, a source electrode S3 connected to the drain electrode D1 of the driving thin film transistor T1 and simultaneously, connected to an anode of the organic light emitting diode OLD via the light emission control transistor T6, and a drain electrode D3 connected to the drain electrode D4 of the initialization transistor T4, the gate electrode G1 of the driving thin film transistor T1, one end Cst1 of the storage capacitor Cst, and one end Cb1 of the boosting capacitor Cb. The compensation transistor T3 is turned on according to the scan signal Sn received through the scan line 151. The compensation transistor T3 connects the gate electrode G1 and the drain electrode D1 of the driving thin film transistor T1 and diode-connect the driving thin film transistor T1.

The initialization transistor T4 has a gate electrode G4 connected to the previous scan line 152, a source electrode S4 connected to the initialization voltage line 192, and a drain electrode D4 simultaneously connected to one end cb1 of the boosting capacitor Cb, one end Cst1 of the storage capacitor Cst, and the gate electrode G1 of the driving thin film transistor T1 via the drain electrode D3 of the compensation transistor T3. The initialization transistor T4 is turned on according to the previous scan signal Sn-1 from the previous scan line 152 to transfer the initialization voltage Vint to the gate electrode G1 of the driving thin film transistor T1 and to then perform an initialization operation that initializes a gate voltage Vg of the gate electrode G1 of the driving thin film transistor T1.

The operation control transistor T5 has a gate electrode G5 connected to the light emission control line 153, a source electrode S5 connected to the driving voltage line 172, and a drain electrode D5 connected to the source electrode Si of the driving thin film transistor T1 and the drain electrode S2 of the switching thin film transistor T2.

The light emission control transistor T6 has a gate electrode G6 connected to the light emission control line 153, a source electrode S6 connected to the drain electrode D1 of the driving thin film transistor T1 and the source electrode S3 of the compensation transistor T3, and a drain electrode D6 connected to an anode of the organic light emitting diode OLD. The operation control transistor T5 and the light emission control transistor T6 are simultaneously turned on according to the light emission control signal EM from the light emission control line 153. As a result, the driving voltage ELVDD is compensated through the diode-connected driving thin film transistor T1 to be transferred to the organic light emitting diode OLD, and the driving current ld flows to the organic light emitting diode OLD to emit light of an image.

The scan line 151 connected to the gate electrode G2 of the switching thin film transistor T2 is connected to the other end Cb2 of the boosting capacitor Cb, and one end Cb1 of the boosting capacitor Cb is connected to the gate electrode G1 of the driving thin film transistor T1.

The other end Cst2 of the storage capacitor Cst is connected to the driving voltage line 172, and a cathode of the organic light emitting diode OLD is connected to a common voltage line 741 transferring a common voltage ELVSS.

The pixel therefore has a 6T-2C structure, e.g., six transistors and two capacitors. The pixel may have a different structure (e.g., a different number of transistors and/or capacitors) in another embodiment.

In operation, in an initializing period, the previous scan signal Sn-1 having a low level is supplied through the previous scan line 152. Then, the initialization transistor T4 is turned on based on the previous scan signal Sn-1 having the low level, the initialization voltage Vint travels from the initialization voltage line 192 to the gate electrode G1 of the driving thin film transistor T1 through the initialization transistor T4, and the driving thin film transistor T1 is initialized by the initialization voltage Vint.

In a subsequent data programming period, the scan signal Sn having the low level is supplied through the scan line 151. Then, the switching thin film transistor T2 and the compensation transistor T3 are turned on based on the scan signal Sn having the low level. In this case, the driving thin film transistor T1 is diode-connected by the turned-on compensation transistor T3 and biased in a forward direction.

Then, a compensation voltage Dm+Vth (Vth has a negative (−) value) reduced from the data signal Dm supplied from the data line 171 by a threshold voltage Vth of the driving thin film transistor T1 is applied to the gate electrode G1 of the driving thin film transistor T1. For example, the gate voltage Vg applied to the gate electrode G1 of the driving thin film transistor T1 becomes the compensation voltage Dm+Vth. The driving voltage ELVDD and the compensation voltage Dm+Vth are applied to respective ends of the storage capacitor Cst, and a charge corresponding to a voltage difference between the ends is stored in the storage capacitor Cst.

Thereafter, when the voltage level of the scan signal Sn is changed to a high level while the supply of the scan signal Sn stops, the gate voltage Vg applied to the gate electrode G1 of the driving thin film transistor T1 is changed based on a voltage change width of the scan signal Sn by coupling the boosting capacitor Cb. In this case, since the gate voltage Vg applied to the gate electrode G1 of the driving thin film transistor T1 is changed by charge sharing between the storage capacitor Cst and the boosting capacitor Cb, a voltage change amount applied to the gate electrode G1 is changed in proportion to a charge sharing value between the storage capacitor Cst and the boosting capacitor Cb in addition to the voltage change width of the scan signal Sn.

Thereafter, for the emission period, the light emission control signal EM from the light emission control line 153 is changed from the high level to the low level. Then, in the emission period, the operation control transistor T5 and the light emission control transistor T6 are turned on by the light emission control signal EM at the low level.

Then, the driving current ld is generated according to a voltage difference between the gate voltage Vg of the gate electrode G1 of the driving thin film transistor T1 and the driving voltage ELVDD. The driving current ld is supplied to the organic light emitting diode OLD through the light emission control transistor T6. In the emission period, the driving gate-source voltage Vgs of the driving thin film transistor T1 is maintained to '(Dm+Vth)-ELVDD' by the storage capacitor Cst. According to the current-voltage relationship of the thin film transistor T1, the driving current ld is proportional to the square '(Dm-ELVDD)' of a value obtained by subtracting the threshold voltage Vth from the driving source-gate voltage Vgs. Accordingly, the driving current ld is determined regardless of the threshold voltage Vth of the driving thin film transistor T1.

Figure 2:
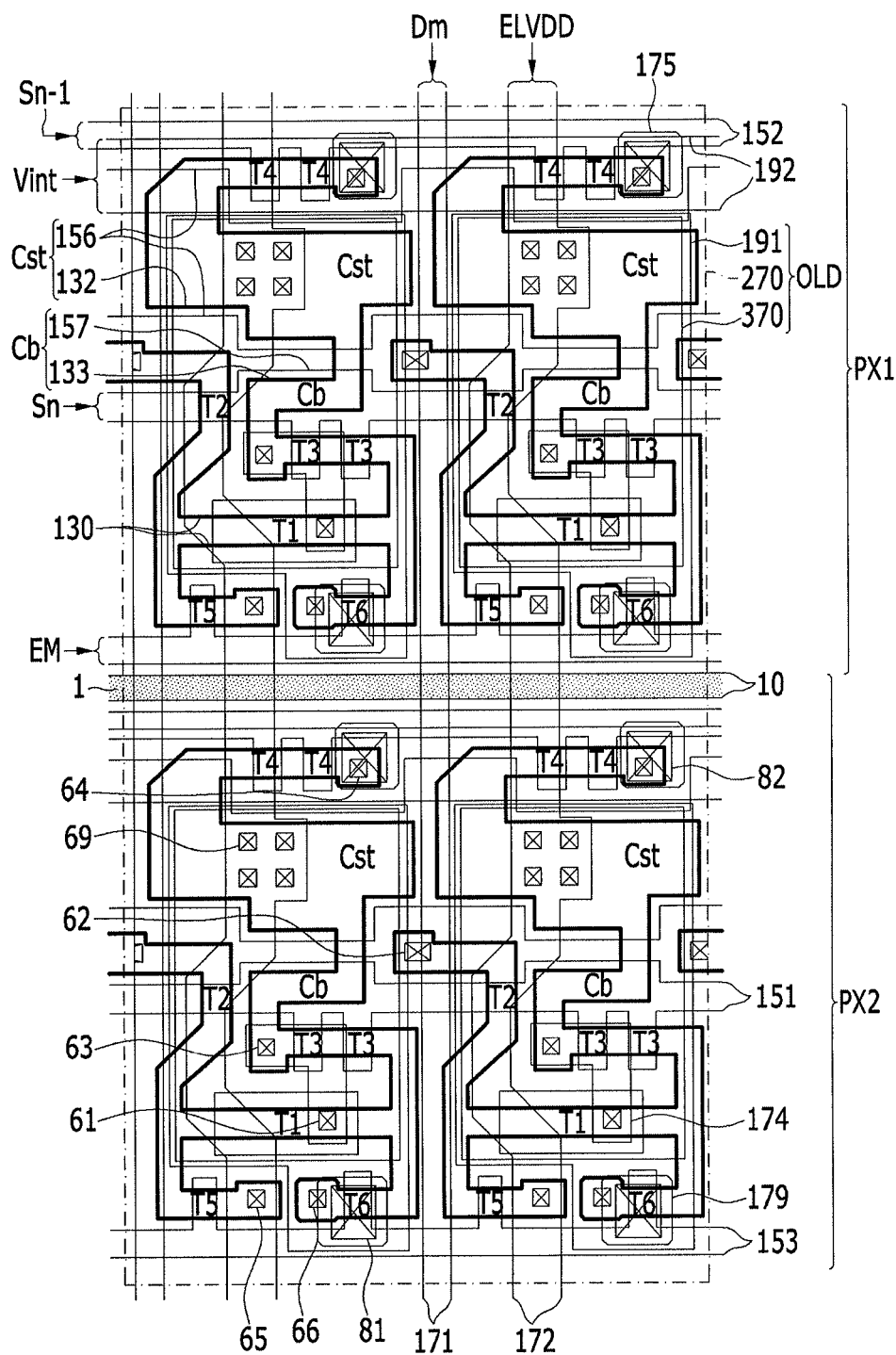
FIG. 2 illustrates an example layout the organic light emitting diode display.
Figure 3:
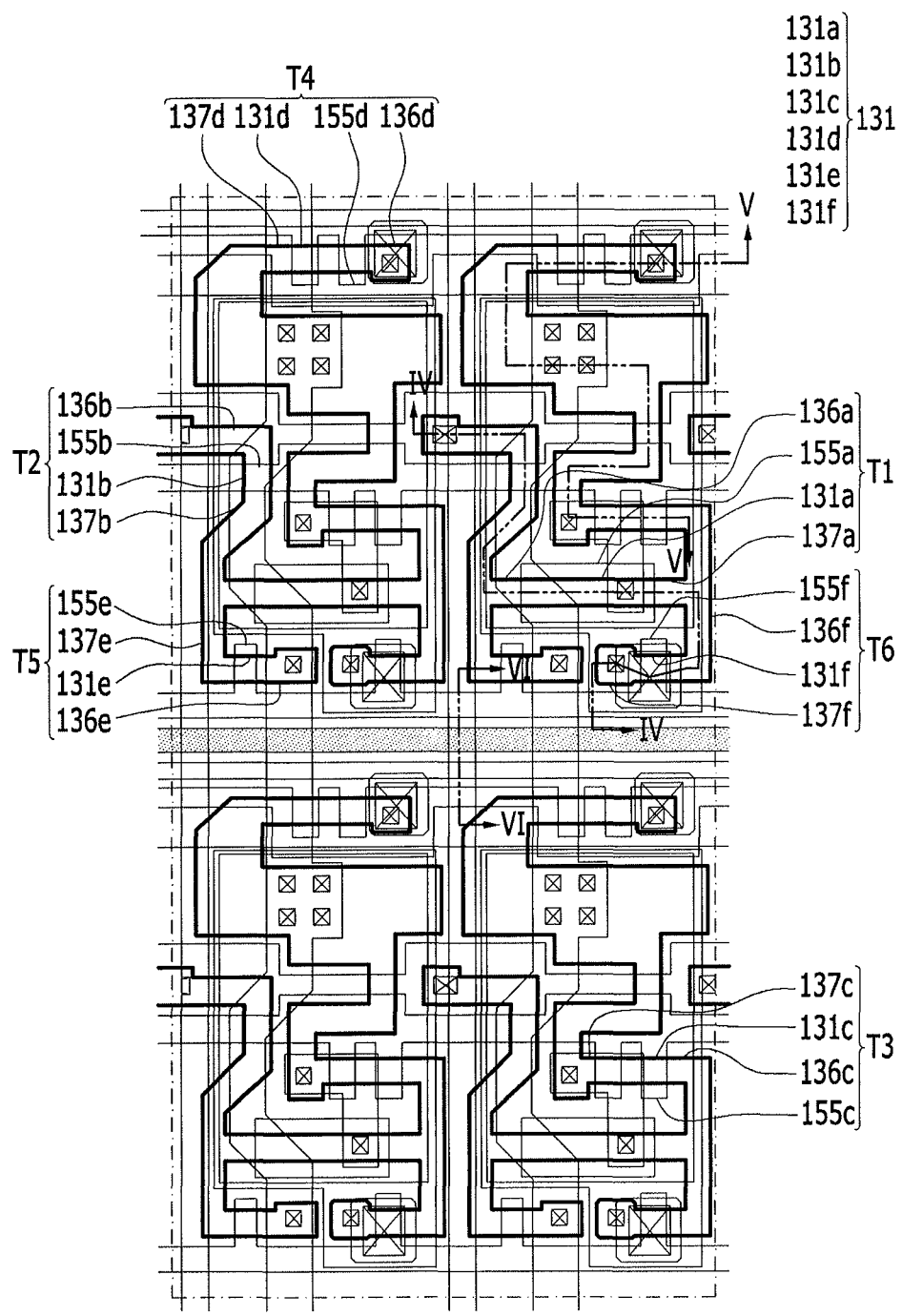
FIG. 3 illustrates a detailed layout of the organic light emitting diode display.
Figure 4:
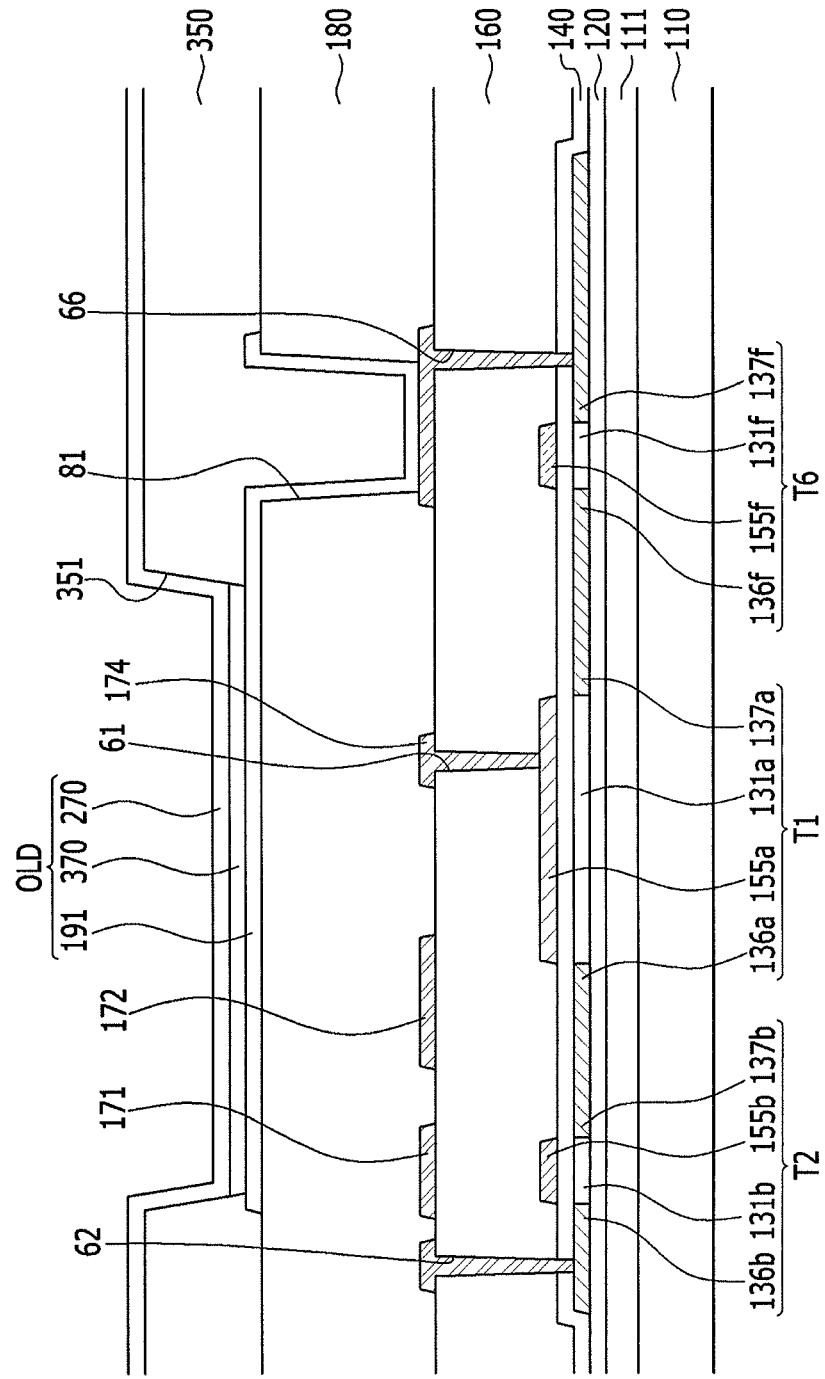
FIG. 4 illustrates a view of the display along section line IV-IV in FIG. 3.
Figure 5:
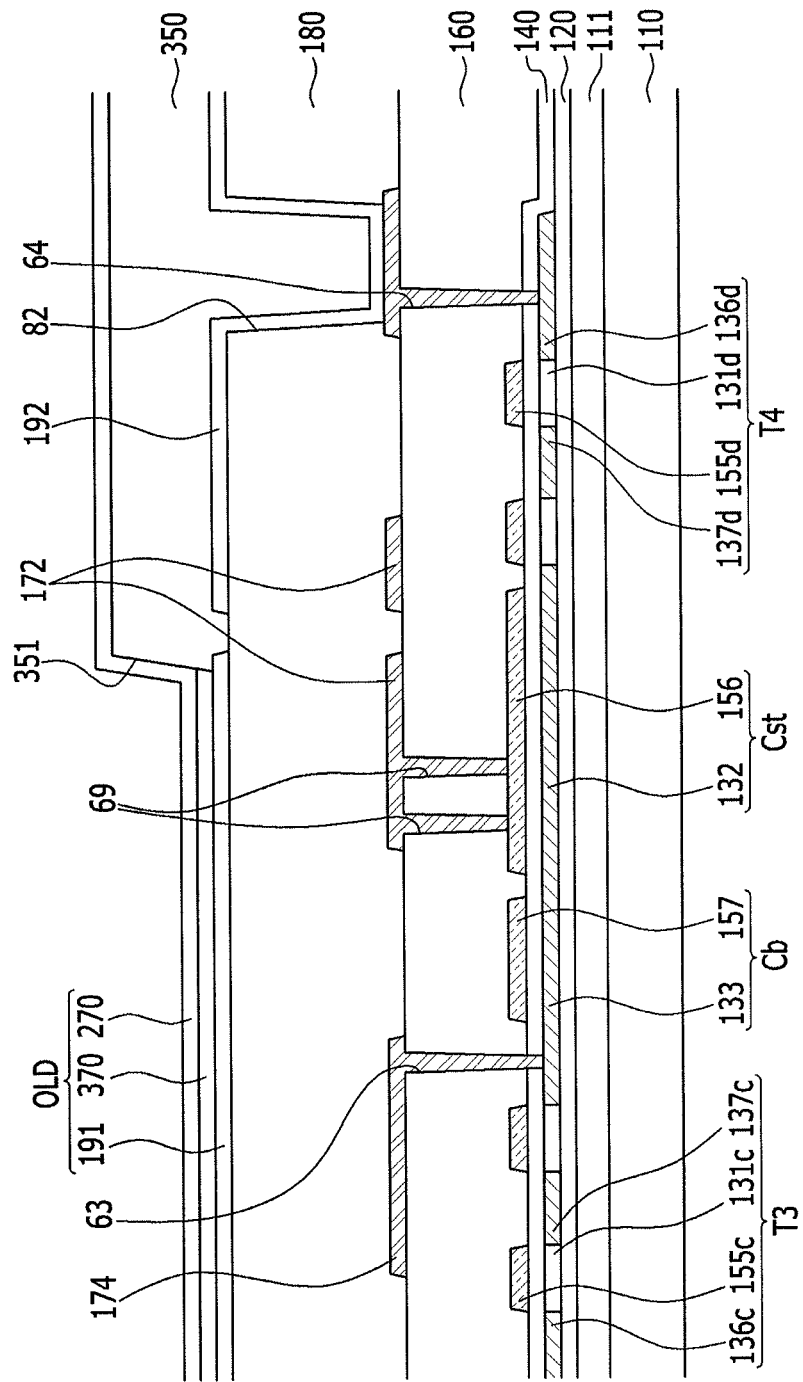
FIG. 5 illustrates a view of the display along section line V-V in FIG. 3.
Figure 6:
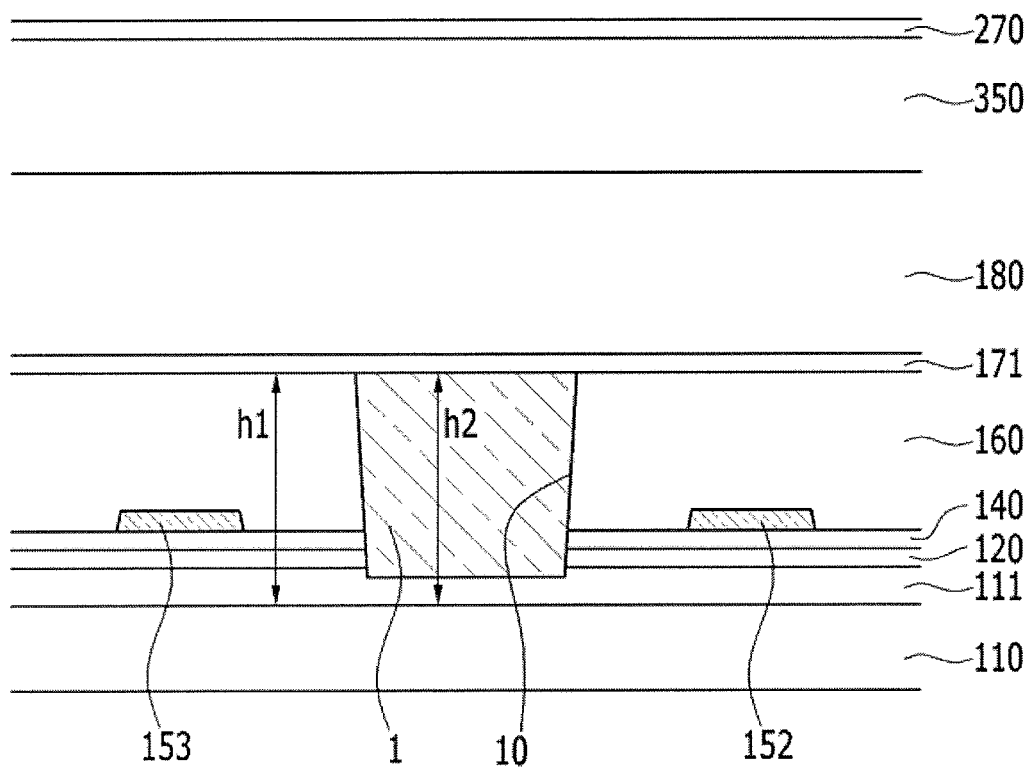
FIG. 6 illustrates a view of the display along section line VI-VI in FIG. 3.

FIG. 2 illustrates an example of a layout (e.g., planar) view of the pixel. FIG. 3 provides more detailed view of this layout, FIG. 4 is a cross-sectional view of the organic light emitting diode display of FIG. 3 taken along line IV-IV, FIG. 5 is a cross-sectional view of the organic light emitting diode display of FIG. 3 taken along line V-V, and FIG. 6 is a cross-sectional view of the organic light emitting diode display of FIG. 3 taken along line VI-VI.

As illustrated in FIG. 2, the organic light emitting diode display includes scan lines 151, previous scan lines 152, light emission control lines 153, and initialization voltage lines 192 which respectively apply the scan signal Sn, the previous scan signal Sn-1, the light emission control signal EM, and the initialization voltage Vint. These lines are formed in a row direction. The display also includes data lines 171 and a driving voltage lines 172 which cross the scan lines 151, previous scan lines 152, light emission control lines 153, and initialization voltage lines 192 and respectively apply the data signal Dm and the driving voltage ELVDD to a plurality of pixels PX. In FIG. 2, four pixels PX connected to two scan lines 151, two previous scan lines 152, two light emission control lines 153, two initialization voltage lines 192, two data lines 171, and two driving voltage lines 172 are shown for illustrative purposes.

Each pixel PX includes the driving thin film transistor T1, the switching thin film transistor T2, the compensation transistor T3, the initialization transistor T4, the operation control transistor T5, the light emission control transistor T6, the storage capacitor Cst, the boosting capacitor Cb, and the organic light emitting diode OLD. The organic light emitting diode OLD includes a pixel electrode 191, an organic emission layer 370, and a common electrode 270. In this case, the compensation transistor T3 and the initialization transistor T4 are configured by a dual gate structure transistor in order to block leakage current.

Channels of the driving thin film transistor T1, the switching thin film transistor T2, the compensation transistor T3, the initialization transistor T4, the operation control transistor T5, and the light emission control transistor T6 are formed inside one semiconductor 130. The semiconductor 130 may curve in various shapes and, for example, may include polysilicon or an oxide semiconductor. Examples of the oxide semiconductor include titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide (InGaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In-Al-Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O) which are complex oxide thereof. When the semiconductor 130 is formed of an oxide semiconductor, a separate passivation layer may be added to protect the oxide semiconductor which has been shown to be vulnerable to an external environmental conditions (e.g., high temperature) in some circumstances.

The semiconductor 130 includes a channel doped with an N-type impurity or a P-type impurity, and a source doping region and a drain doping region formed at respective sides of the channel. In one embodiment, the source and drain regions may be doped at a higher concentration than the doping impurity used to dope the channel. In one embodiment, the source doping region and the drain doping region correspond to the source electrode and the drain electrode, respectively. The source electrode and the drain electrodes formed in the semiconductor 130 may be formed, for example, by doping only the corresponding regions. Further, in the semiconductor 130, a region between source electrodes and drain electrodes of different transistors is doped, and thus the source electrode and the drain electrode may be electrically connected to each other.

As illustrated in FIG. 2, the channel 131 in the semiconductor 130 includes a driving channel 131a in the drive transistor T1, a switching channel 131b in the switching thin film transistor T2, a compensation channel 131c in the compensation transistor T3, an initialization channel 131d in the initialization transistor T4, an operation control channel 131e in the operation control transistor T5, and a light emission control channel 131f in the light emission control transistor T6. In addition, a first storage electrode 132 and a first boosting electrode 133 may be formed in the semiconductor 130.

The driving thin film transistor T1 includes a driving channel 131a, a driving gate electrode 155a, a driving source electrode 136a, and a driving drain electrode 137e. The driving gate electrode 155a overlaps the driving channel 131a. The driving source electrode 136a and the driving drain electrode 137a are adjacent to respective sides of the driving channel 131a. The driving gate electrode 155a is connected to the driving connecting member 174 through the contact hole 61.

The switching thin film transistor T2 includes a switching channel 131b, a switching gate electrode 155b, a switching source electrode 136b, and a switching drain electrode 137b. The switching gate electrode 155b is a part of the scan line 151 and overlaps the switching channel 131b. The switching source electrode 136b and the switching drain electrode 137b are adjacent to respective sides of the switching channel 131b. The switching source electrode 136b is connected to the data line 171 through a contact hole 62.

The compensation transistor T3 includes a compensation channel 131c, a compensation gate electrode 155c, a compensation source electrode 136c, and a compensation drain electrode 137c. Two compensation gate electrodes 155c are formed to prevent leakage current and may include projections that extend downward from the scan line 151. The compensation gate electrode 155c overlaps the compensation channel 131c. The compensation source electrode 136c and the compensation drain electrode 137c are adjacent to respective sides of the compensation channel 131c. The compensation drain electrode 137c is connected to the driving connecting member 174 through a contact hole 63.

The initialization transistor T4 includes an initialization channel 131d, an initialization gate electrode 155d, an initialization source electrode 136d, and an initialization drain electrode 137d. Two initialization gate electrodes 155d are formed to prevent leakage current. The two initialization gate electrodes 155d may be projections that extend downward from the previous scan line 152. The initialization gate electrodes 155d overlap the initialization channel 131d. The initialization source electrode 136d and the initialization drain electrode 137d are adjacent to respective sides of the initialization channel 131d. The initialization source electrode 136d is connected to the initialization connecting member 175 through a contact hole 64. The initialization drain electrode 137d is connected to the driving connecting member 174 through the contact hole 63.

The operation control transistor T5 includes an operation control channel 131e, an operation control gate electrode 155e, an operation control source electrode 136e, and an operation control drain electrode 137e. The operation control gate electrode 155e is a projection that extends upwardly from the light emission control line 153 and overlaps the operation control channel 131e. The operation control source electrode 136e and the operation control drain electrode 137e are adjacent to respective sides of the operation control channel 131e. The operation control source electrode 136e is connected to part of the driving voltage line 172 through a contact hole 65.

The light emission control transistor T6 includes a light emission control channel 131f, a light emission control gate electrode 155f, a light emission control source electrode 136f, and a light emission control drain electrode 137f. The light emission control gate electrode 155f is a projection that extends upwardly from the light emission control line 153 and overlaps the light emission control channel 131f. The light emission control source electrode 136f and the light emission control drain electrode 137f are adjacent to respective sides of the light emission control channel 131f. The light emission control drain electrode 137f is connected to a light emission control connecting member 179 through a contact hole 66.

The driving source electrode 136a is connected to the switching drain electrode 137b and the operation control drain electrode 137e. The driving drain electrode 137a is connected to the compensation source electrode 136c and the light emission control source electrode 136f.

The storage capacitor Cst includes a gate insulating layer 140 between a first storage electrode 132 and a second storage electrode 156. The gate insulating layer 140 includes a dielectric material and a storage capacitance is determined based on charges stored in storage capacitor Cst and a voltage between the two electrodes 132 and 156.

The first storage electrode 132 is formed on the same layer as the channel 131. The second storage electrode 156 is formed on the same layer as the scan line 151, the previous scan line 152, and the light emission control line 153. The first storage electrode 132 includes a doping impurity.

The first storage electrode 132 is formed between the compensation drain electrode 177c and the initialization drain electrode 177d, and is connected to the driving gate electrode 155a through the first boosting electrode 133 and the driving connecting member 174. The second storage electrode 156 is connected to the driving voltage line 172 through a contact hole 69.

The storage capacitor Cst has a storage capacitance that corresponds to the difference between the driving voltage ELVDD transferred to the second storage electrode 156 through the driving voltage line 172 and the gate voltage Vg of the driving gate electrode 155a.

The first boosting electrode 133 of the boosting capacitor Cb extends from the first storage electrode 132. The second boosting electrode 157 is a projection that extends upwardly from the scan line 151. The boosting capacitor Cb performs a boosting operation to increase the gate voltage Vg of the driving gate electrode 155a based on a change of the scan signal Sn of the scan line 151 to improve driving range, and to thereby implement more accurate grayscale light emissions.

The driving connecting member 174 is formed on the same layer as the data line 171. One end of the driving connecting member 174 is connected to the driving gate electrode 155a through the contact hole 61. The other end of the driving connecting member 174 is connected to the compensation drain electrode 137c of the compensation transistor T3 through the contact hole 63. Accordingly, the driving connecting member 174 connects the driving gate electrode 155a and the compensation drain electrode 137c of the compensation transistor T3 to each other.

The initialization connecting member 175 has a predetermined (e.g., quadrangular) shape and is connected to the initialization voltage line 192 through the contact hole 82. The light emission control connecting member 179 has a predetermined (e.g., quadrangular or another shape) is connected to the pixel electrode 191 of the organic light emitting diode OLD through the contact hole 81. In the exemplary embodiment in FIGS. 2 and 3, the initialization voltage line has a linear shape parallel to the scan line and the pixel electrode has a substantially quadrangular shape which almost covers the pixel. In another embodiments, the pixel electrode and the initialization voltage line may have different shapes which allow for connection to the initialization connecting member and the light emission control connecting member.

A separation groove 10 separates two adjacent pixels PX1 and PX2 and is oriented in the direction of the data line 171. For example, the separation groove 10 is formed between the light emission control line 153 of the first pixel PX1 and the previous scan line 152 of the second pixel PX2. A filling material 1 may be in the separation groove 10. The separation groove 10 extends in the same direction as the extending direction of the scan line 151, and the filling material 1 is in the extending direction of the separation groove 10.

The data line 171 and the driving voltage line 172 traverse the separation groove 10 and the filling material 1. Because the separation groove 10 is formed between the two adjacent pixels PX1 and PX2, the pixels PX1 and PX2 may have an island-type structure. Accordingly, when the organic light emitting diode display is curved, folded, or rolled, stress generated in the pixels PX1 and PX2 of the organic light emitting diode display is distributed to prevent damage to the pixels PX1 and PX2. Further, the filling material 1 may be made of an elastic material to fill the separation groove 10. As a result, since the entire path of the data line and the driving voltage line that pass straight across the top of the filling material 1 is shortened, compared with the case where the data line 171 and the driving voltage line 172 extend over the inner wall of the separation groove 10, the resistance of the data line and the driving voltage line may be decreased.

FIGS. 4, 5, and 6 illustrate examples of the organic light emitting diode display in cross-section according to a laminating order. The laminated structure of the operation control transistor T5 may be mostly the same as that of the light emission control transistor T6.

A barrier film 111 is formed on the substrate 110, and a buffer layer 120 is formed on the barrier film. The substrate 110 may be made of a material having flexible and insulative properties. For example, the substrate may include an organic material, e.g., thin glass, polyethersulfone (PES), polyacrylate, (PAR), polyetherimide (PEI), polyethylene napthalate (PEN), polyethyleneterepthalate (PET), polyphenylene sulfide (PPS), polyarylate, polyimide (PI), polycarbonate (PC), triacetate cellulose (TAC), and cellulose acetate propionate (CAP).

The barrier film 111 may be formed to improve a characteristic of polysilicon. This may be accomplished, for example, by preventing impurities from permeating from the substrate during a crystallization process for forming the polysilicon of the semiconductor 130. The barrier film 111 may be, include, silicon nitride ($SiN_x$) or silicon oxide ($SiO_2$). The buffer layer 120 serves to planarize the barrier film 111 to alleviate the stress applied to the semiconductor 130 on the buffer layer 120. The buffer layer 120 may include, for example, silicon nitride ($SiN_x$) or silicon oxide ($SiO_2$). Both the barrier film 111 and buffer layer 120 may be formed or only any one of them may be formed.

The semiconductor 130 is formed on the buffer layer 120. The semiconductor 130 includes the driving channel 131a, the switching channel 131b, the compensation channel 131c, the initialization channel 131d, the operation control channel 131e, the light emission control channel 131f, the first storage electrode 132, and the first boosting electrode 133. A driving source electrode 136a and a driving drain electrode 137a are formed on respective sides of the driving channel 131a in the semiconductor 130. A switching source electrode 136b and a switching drain electrode 137b are formed on respective sides of the switching channel 131b.

In addition, the compensation source electrode 136c and the compensation drain electrode 137c are formed at respective sides of the compensation channel 131c. The initialization source electrode 136d and the initialization drain electrode 137d are formed at respective sides of the initialization channel 131d.

In addition, an operation control source electrode 136e and an operation control drain electrode 137e are formed at respective sides of the operation control channel 131e. A light emission control source electrode 136f and a light emission control drain electrode 137f are formed at respective sides of the light emission control channel 131f. The first storage electrode 132 and the first boosting electrode 133 are formed between the compensation drain electrode 137c and the initialization drain electrode 137d.

The gate insulating layer 140 is formed on the semiconductor 130. The gate insulating layer 140 may include, for example, silicon nitride ($SiN_x$) or silicon oxide ($SiO_2$).

Gate wires are formed on the gate insulating layer 140. The gate wires include the scan line 151 including the switching gate electrode 155b and the compensation gate electrode 155c, the previous scan line 152 including the initialization gate electrode 155d, the light emission control line 153 including the operation control gate electrode 155e and the light emission control gate electrode 155f, the driving gate electrode 155e, the second storage electrode 156, and the second boosting electrode 157.

The gate wires 151, 152, 153, 155a, 156, and 157 may be formed in a multilayer which include metal layers of, for example, one or more of copper (Cu), a copper alloy, aluminum (Al), an aluminum alloy, molybdenum (Mo), and a molybdenum alloy.

An interlayer insulating layer 160 is formed on and covers the gate insulating layer 140 and the gate wires 151, 152, 153, 155a, 156, and 157. The interlayer insulating layer 160 may be include, for example, silicon nitride ($SiN_x$) or silicon oxide ($SiO_2$).

A separation groove 10 that separates two pixels PX1 and PX2 from each other is formed through the interlayer insulating layer 160, the gate insulating layer 140, the buffer layer 120, and the barrier film 111. The filling material 1 is in the separation groove 10. In this case, a height h1 from an upper surface of the substrate 110 to an upper surface of the interlayer insulating layer 160 may be the same as a height h2 from the upper surface of the substrate 110 to an upper surface of the filling material 1.

The filling material 1 may include an elastic material, e.g., an organic material or a viscoelastic material. An example of the viscoelastic material includes a pressure sensitive adhesive (PSA) which easily deforms under stress.

In one embodiment, the Young's modulus of the filling material 1 may be smaller than Young's modulus of the interlayer insulating layer 160, the gate insulating layer 140, the buffer layer 120, and the barrier film 111. Accordingly, even though the substrate 110 is curved, folded, or rolled, the stress is reduced or minimized at a portion where the filling material 1 is positioned. Accordingly, on a plane, generation of the stress in the pixels PX1 and PX2 positioned on and below the filling material 1 is reduced or minimized, thereby preventing damage to the pixels PX1 and PX2.

A number of data wires are formed on the second insulating layer 160. The data wires include the data line 171, the driving voltage line 172, the driving connecting member 174, the initialization connecting member 175, and the light emission control connecting member 179. The data wires 171, 172a, 174, 175, 178, and 179 may be formed in a multilayer which include metal layers made, for example, of copper (Cu), a copper alloy, an aluminum (Al), an aluminum alloy, molybdenum (Mo), and/or a molybdenum alloy. The multilayer may be a triple layer of titanium/aluminum/titanium (Ti/Al/Ti), a triple layer molybdenum/aluminum/molybdenum (Mo/Al/Mo), or molybdenum/copper/molybdenum (Mo/Cu/Mo), for example.

The data line 171 is connected to the switching source electrode 136b through the contact hole 62 formed to have the same boundary line in the gate insulating layer 140 and the interlayer insulating layer 160. One end of the driving connecting member 174 is connected to the driving gate electrode 155a through the contact hole 61 in the interlayer insulating layer 160. The other end of the driving connecting member 174 is connected to the compensation drain electrode 137c through the contact hole 63 formed to have the same boundary line in the gate insulating layer 140 and the interlayer insulating layer 160.

The initialization connecting member 175 is connected to the initialization source electrode 136d through the contact hole 64 formed in the gate insulating layer 140 and the interlayer insulating layer 160. The light emission control connecting member 179 is connected to the light emission control drain electrode 137f through a contact hole 66 formed on the gate insulating layer 140 and the interlayer insulating layer 160.

In this case, the data line 171 and the driving voltage line 172 pass the filling material 1. Since the height h1 from the upper surface of the substrate 110 to the upper surface of the interlayer insulating layer 160 is the same as the height h2 from the upper surface of the substrate 110 to the upper surface of the filling material 1, the data line 171 and the driving voltage line 172 allow the filling material 1 to pass into or straight through without bending. Accordingly, since the entire path of the data line 171 and the driving voltage line 172 pass straight across the top of the filling material 1 is shortened, and therefore the resistance of the data line 171 and driving voltage line 172 may be reduced.

Further, since the data metal layer is formed on the filling material 1 without bending, the data metal layers between the data line 171 and the driving voltage line 172 may be removed when patterning the data metal layer to the data line 171 and the driving voltage line 172 using a photolithography process. Thus, because there is no remaining data metal layer which is not etched between the data line 171 and the driving voltage line 172, the data line and the driving voltage line are disconnected from each other and thus do not form a current leakage pass.

Further, since a distance between the light emission control line 153 and the previous scan line 152, which are the gate wires adjacent to the separation groove 10 and the data line 171 or the driving voltage line 172, is increased by filling the separation groove 10 with the filling material 1, a disconnection between the light emission control line 153 and the previous scan line 152 and the data line 171 or the driving voltage line 172 may be prevented.

A passivation layer 180 is formed on and covers the data wires 171, 172, 174, and 179 and the interlayer insulating layer 160. Since the passivation layer 180 covers and planarizes the data wires 171, 172, 174, and 179, the pixel electrode 191 may be formed on the passivation layer 180 without a step. The passivation layer 180 may include, for example, organic material (e.g., polyacrylates resin or polyimides resin) or a laminated layer of the organic material and an inorganic material.

A pixel electrode 191 and an initialization voltage line 192 are formed on the passivation layer 180. The light emission control connecting member 179 is connected to the pixel electrode 191 through the contact hole 81 in the passivation layer 180. The initialization connecting member 175 is connected to the initialization voltage line 192 through the contact hole 82 formed in the passivation layer 180.

A pixel defined layer (PDL) 350 covering the passivation layer 180, the initialization voltage line 192, and the pixel electrode 191 is formed on edges of the passivation layer 180, the initialization voltage line 192, and the pixel electrode 191. The pixel defining layer PDL 350 has a pixel opening 351 that exposes the pixel electrode 191. The PDL 350 may include, for example, an organic material (e.g., polyacrylates resin or polyimides resin) or a silica-based inorganic material.

An organic emission layer 370 is formed on the pixel electrode 191 exposed by the pixel opening 351. A common electrode 270 is formed on the organic emission layer 370. The common electrode 270 is formed on the PDL 350 and over the plurality of pixels. The organic light emitting diode OLD is formed to include the pixel electrode 191, the organic emission layer 370, and the common electrode 270.

The pixel electrode 191 is an anode which is a hole injection electrode, and the common electrode 270 is a cathode which is an electron injection electrode. In another embodiment, the pixel electrode 191 may be the cathode and the common electrode 270 may be the anode. Hole and electrons are injected into the organic emission layer 370 from the pixel electrode 191 and the common electrode 270, respectively. As a result, excitons are generated by coupling the injected holes and electrons. When the excitons falls from an excited state to a ground state, light is emitted.

The organic emission layer 370 may include, for example, a low-molecular organic material or a high-molecular organic material such as poly 3,4-ethylenedioxythiophene (PEDOT). The organic emission layer 370 may be formed in a multilayer including a light emission layer and one or more of a hole injection layer (HIL), a hole transporting layer (HTL), an electron transporting layer (ETL), and an electron injection layer (EIL). When the organic emission layer includes all of the aforementioned layers, the HIL may be disposed on the pixel electrode 191 which is the anode and the HTL, the light emitting layer, the ETL, the EIL may be sequentially laminated thereon.

The organic emission layer 370 may include a red organic emission layer to emit red light, a green organic emission layer to emit green light, and a blue organic emission layer to emit blue light. The red organic emission layer, the green organic emission layer, and the blue organic emission layer are therefore formed in a red pixel, a green pixel, and a blue pixel respectively, to thereby implement a color image.

In the organic emission layer 370, all of the red organic emission layer, the green organic emission layer, and the blue organic emission layer may be laminated together on the red pixel, the green pixel, and the blue pixel, and a red color filter, a green color filter, and a blue color filter may be formed for each pixel, thereby implementing a color image.

In another example, white light emitting layers emitting white light are formed on all of the red pixel, the green pixel, and the blue pixel, and a red color filter, a green color filter, and a blue color filter are formed for each pixel, thereby implementing a color image. In implementing a color image using the white organic emission layer and the color filters, a deposition mask may not have to be used for depositing the red organic emission layer, the green organic emission layer, and the blue organic emission layer on respective pixels, e.g., to form the red pixel, the green pixel, and the blue pixel.

In another example, the white organic emission layer may be formed by one organic emission layer and may also include a configuration formed to emit white light by laminating a plurality of organic emission layers. For example, the white organic emission layer may include a configuration which emits white light by combining at least one yellow organic emission layer and at least one blue light emitting layer, a configuration which emits white light by combining at least one cyan organic emission layer and at least one red light emitting layer, a configuration which emits white light by combining at least one magenta organic emission layer and at least one green light emitting layer, and the like.

An encapsulation member to protect the organic light emitting diode OLD may be formed on the common electrode 270. The encapsulation member may be sealed on the substrate 110 by a sealant and may include, for example, glass, crystal, ceramic, plastic, or metal. A thin film encapsulation layer may be formed by depositing an inorganic layer and an organic layer on the common electrode 270 without using the sealant.

In one exemplary embodiment, the separation groove and the filling material are formed between the pixels in all regions of the substrate. In another embodiment, the separation groove and the filling material may only be formed between pixels at a folding area.

Figure 7:
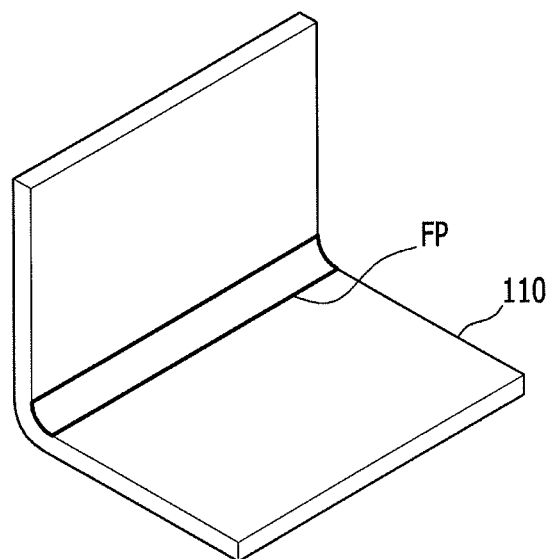
FIG. 7 illustrates an other embodiment of an organic light emitting diode display.

FIG. 7 illustrates another embodiment of an organic light emitting diode display, which is substantially the same as the embodiment in FIGS. 1 to 6 except that the separation groove and the filling material are only formed between pixels at a folding area which is folded in the substrate.

As illustrated in FIG. 7, the substrate 110 has a folding area corresponding to a folding part (FP). The separation groove 10 which separates two pixels PX1 and PX2 from each other is formed between the two pixels PX1 and PX2 positioned at the folding part FP. In addition, the filling material 1 is in the separation groove 10. The separation groove and the filling material may only be formed in the pixel formed at the folding part in order to implement a high-resolution structure, compared with the case where the separation groove and filling material are formed in the pixels at all regions of the substrate.

By way of summation and review, various types of organic light emitting diode displays have been developed. Examples includes flexible displays, curved displays, foldable displays, rollable displays, and stretchable displays. When the display is curved, folded, or rolled, stress is generated by an inorganic layer, e.g., barrier layer, buffer layer, gate insulating layer, or an interlayer insulating layer. In order to distribute the stress, a groove may be formed by etching part of the inorganic layer between pixels. The etching separates the pixels to create an island-type structure.

However, the thickness of the inorganic layer between a gate electrode and a data line or a driving voltage line is decreased when over-etching occurs. In this case, the inorganic layer may serve as a current leakage pass.

Further, the tapered angle of a data metal layer in the groove may increase as a result of the etching, and thus the thickness of the data metal layer in the groove may partially increase. Accordingly, when the data line or the driving voltage line is formed by etching the data metal layer by a photolithography process substantially in the vertical direction at the groove, at least a portion of the data metal layer may not be etched. The unetched portion of the data metal layer may disconnect the data line and the driving voltage line from each other to create the current leakage pass.

Further, when the groove is formed by etching the inorganic layer, the entire path of the data line or the driving voltage line passing through the groove increases. Consequently, the resistance of the data line or the driving voltage line increases and thus it is difficult to stably supply current to the pixel.

In accordance with one or more of the aforementioned embodiments, a groove is formed to separate two adjacent pixels from each other and a filling material is located in the groove. As a result, the entire path of a data line and driving voltage line that pass straight across the top of the filling material is shortened. Thus, the resistance of the data line and driving voltage line may be reduced to improve display quality.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. An organic light emitting diode display, comprising:
a flexible substrate including a folding area and a flat area;
a first insulating layer on the flexible substrate, and having a first opening;
a first conductor on the first insulating layer;
a second insulating layer covering the first conductor and the first insulating layer, and having the first opening;
a second conductor on the second insulating layer;
a third insulating layer covering the second conductor and the second insulating layer; and
a filling material in the first opening, the filling material made of an electrically insulative material, wherein
a thickness of the filling material in the first opening is less than a thickness from a bottom surface of the first insulating layer to an upper surface of the second insulating layer.

2. The organic light emitting diode display as claimed in claim 1, wherein the first insulating layer includes a barrier film, a buffer layer, and a first gate insulating layer.

3. The organic light emitting diode display as claimed in claim 1, further comprising:
a pixel electrode connected to the second conductor through a second opening of the third insulating layer.

4. The organic light emitting diode display as claimed in claim 1, wherein the first conductor includes a scan line to transfer a scan signal.

5. The organic light emitting diode display as claimed in claim 1, wherein the second conductor includes a data line to transfer a data signal.

6. The organic light emitting diode display as claimed in claim 1, wherein the first opening is located in the folding area.

7. The organic light emitting diode display as claimed in claim 1, wherein the first insulating layer includes multiple layers.

8. An organic light emitting diode display, comprising:
a flexible substrate including a folding area and a flat area;
a first insulating layer on the flexible substrate, and having a first opening;
a first conductor on the first insulating layer;
a second insulating layer covering the first conductor and the first insulating layer, and having the first opening;
a second conductor on the second insulating layer;
a third insulating layer covering the second conductor and the second insulating later; and
a filling material in the first opening, wherein
a thickness of the filling material in the first opening is less than a thickness from a bottom surface of the first insulating layer to an upper surface of the second insulating layer,
the first insulating layer includes an inorganic material, and
the filling material includes an elastic material.

9. The organic light emitting diode display as claimed in claim 8, wherein a Young's modulus of the filling material is smaller than a Young's modulus of the first insulating layer.

10. The organic light emitting diode display as claimed in claim 8, wherein the elastic material includes an organic material or a viscoelastic material.

11. The organic light emitting diode display as claimed in claim 8, wherein a height from an upper surface of the flexible substrate to the upper surface of the second insulating layer and a height from the upper surface of the flexible substrate to an upper surface of the filling material are equal.

12. An organic light emitting diode display, comprising:
a flexible substrate including a folding area and a flat area;
a first insulating layer on the flexible substrate, and having a first opening;
a first conductor on the first insulating layer;
a second insulating layer covering the first conductor and the first insulating layer, and having the first opening;
a second conductor on the second insulating layer;
a third insulating layer covering the second conductor and the second insulating layer; and
a filling material in the first opening,
wherein at least a portion of the filling material is positioned in the folding area.

* * * * *